US010775451B2

(12) United States Patent
Leese de Escobar et al.

(10) Patent No.: US 10,775,451 B2
(45) Date of Patent: Sep. 15, 2020

(54) SQUID HAVING INTEGRATED RESISTIVE ELEMENT

(71) Applicant: United States Government as represented by the Secretary of the Navy, San Diego, CA (US)

(72) Inventors: Anna Leese de Escobar, Encinitas, CA (US); Robert Lewis Fagaly, Carlsbad, CA (US); Susan Anne Elizabeth Berggren, San Diego, CA (US); Benjamin Jeremy Taylor, Escondido, CA (US); Marcio Calixto de Andrade, San Diego, CA (US)

(73) Assignee: United States Government as represented by the Secretary of the Navy, Washington, DC (US)

( * ) Notice: Subject to any disclaimer, the term of this patent is extended or adjusted under 35 U.S.C. 154(b) by 57 days.

(21) Appl. No.: 16/129,558

(22) Filed: Sep. 12, 2018

(65) Prior Publication Data

US 2020/0081075 A1 Mar. 12, 2020

(51) Int. Cl.
*G01R 33/035* (2006.01)

(52) U.S. Cl.
CPC ................ *G01R 33/0354* (2013.01)

(58) Field of Classification Search
None
See application file for complete search history.

(56) References Cited

U.S. PATENT DOCUMENTS

| 3,758,854 | A | * | 9/1973 | Zimmerman | A61B 5/04005 324/248 |
| 4,733,182 | A | * | 3/1988 | Clarke | G01R 33/0358 324/301 |
| 5,600,242 | A | * | 2/1997 | Hubbell | G01R 33/0354 324/248 |
| 6,043,649 | A | * | 3/2000 | Toyoda | G01R 33/0356 324/248 |
| 9,097,751 | B1 | * | 8/2015 | Longhini | G01R 33/0354 |
| 9,476,950 | B2 | | 10/2016 | Faley et al. | |
| 2012/0088674 | A1 | * | 4/2012 | Faley | G01R 33/035 505/162 |

OTHER PUBLICATIONS

A. M. Zagoskin; Superconducting quantum metamaterials in 3D: possible realizations; Journal of Optics (2012).
S. Butz et al.; Protecting SQUID Metamaterials Against Stray Magnetic Fields; Supercond. Technol 26 (2013).
M. Trepanier et al.; Realization and Modeling of Metamaterials Made of RF Superconducting Quantum-Interference Devices; Physical Review X 3, (2013).
J.-R. Souquet et al.; Fock-State Stabilization and Emission in Superconducting Circuits Using DC-Biased Josephson Junctions; Physical Review A 93, (2016).
Philipp Jung et al.; Topical Review Progress in Superconducting Metamaterials; Supercond. Sci. Technol. 27 (2014).

* cited by examiner

*Primary Examiner* — Nasima Monsur
(74) *Attorney, Agent, or Firm* — Naval Information Warfare Center Pacific; Kyle Eppele; J. Eric Anderson

(57) ABSTRACT

A superconducting quantum interference device (SQUID) for mobile magnetic sensing applications comprising: at least two Josephson junction electrically connected to a superconducting loop; and a resistive element connected in series with one of the Josephson junctions in the superconducting loop. The resistive element is disposed in the same superconducting loop as the at least two Josephson junctions.

17 Claims, 3 Drawing Sheets

SQUID HAVING INTEGRATED RESISTIVE ELEMENT

FEDERALLY-SPONSORED RESEARCH AND DEVELOPMENT

The United States Government has ownership rights in this invention. Licensing and technical inquiries may be directed to the Office of Research and Technical Applications, Space and Naval Warfare Systems Center, Pacific, Code 72120, San Diego, Calif., 92152; voice (619) 553-5118; ssc_pac_t2@navy.mil. Reference Navy Case Number 105826.

BACKGROUND OF THE INVENTION

Superconducting Quantum Interference Devices (SQUIDs) are comprised of tiny loops of superconducting material in which Josephson junctions are placed in the loop path. A Josephson junction is a region of material that provides a weak link between two fully superconducting regions. The direct current (DC) SQUID has two symmetrical Josephson junctions. They are able to sense extremely small magnetic fields. Non-uniforms arrays of DC SQUIDs and DC bi-SQUIDs, which are DC SQUIDs with an additional Josephson junction bisecting the superconducting loop, have been modeled in different array designs and coupling schemes to determine their linearity and sensing capacities and have been fabricated in low temperature superconducting materials. A SQUID-based sensor detects minute magnetic fields and is decoupled from the size of the signal's wavelength. Hence the device can sense signals in the DC-GHz range, but still be contained fully on a ~1×1 cm chip.

SQUID sensors require a magnetic flux bias in order to operate. DC SQUIDs are sensitive devices that may be used for measuring vector components and spatial gradients of magnetic fields, as well as an ability to resolve tiny changes in large signals. These features are particularly useful and have already been implemented in many applications such as low-noise amplifiers, biomagnetic research, nondestructive evaluations, and geomagnetic exploration. In order for the SQUID sensor to function while moving some way is needed to mitigate the changes in the earth's magnetic field due to the movement of the sensor.

SUMMARY

Disclosed herein is a superconducting quantum interference device (SQUID) for mobile applications comprising: at least one Josephson junction electrically connected to a superconducting loop; and a resistive element connected in series with the Josephson junction in the superconducting loop.

Multiple SQUIDs, as disclosed herein, may be formed into an array for mobile applications comprising: a plurality of SQUIDs electrically connected together to form the array, wherein each of the SQUIDs comprises two Josephson junctions electrically connected in parallel in a superconducting loop, and a resistive element connected in series between the Josephson junctions such that a direct current (DC) response of the SQUID array is eliminated.

One embodiment of the SQUID consists of: two Josephson junctions electrically connected in parallel in a superconducting loop; and a resistive element connected in series between the Josephson junctions.

BRIEF DESCRIPTION OF THE DRAWINGS

Throughout the several views, like elements are referenced using like references. The elements in the figures are not drawn to scale and some dimensions are exaggerated for clarity.

DETAILED DESCRIPTION OF EMBODIMENTS

The disclosed apparatus below may be described generally, as well as in terms of specific examples and/or specific embodiments. For instances where references are made to detailed examples and/or embodiments, it should be appreciated that any of the underlying principles described are not to be limited to a single embodiment, but may be expanded for use with any of the other methods and systems described herein as will be understood by one of ordinary skill in the art unless otherwise stated specifically.

Figure 1:
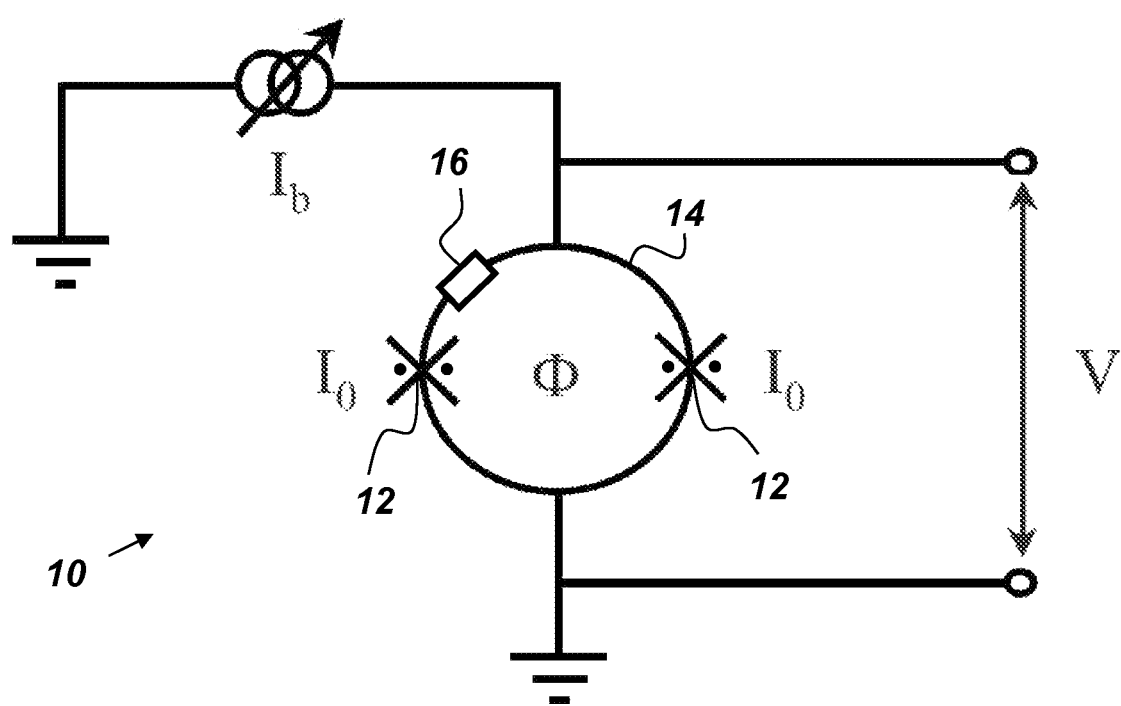
FIG. 1 is an electrical schematic of a SQUID with a resistive element.

FIG. 1 is a circuit diagram of an embodiment of a SQUID 10 that comprises, consists of, or consists essentially of at least two Josephson junction 12 and a resistive element 16 all electrically connected to a superconducting loop 14. The presence of the resistive element 16 reduces the DC response of the SQUID 10 as the SQUID 10 moves through a magnetic field, such as the Earth's magnetic field without the need of being connected to a feedback loop. As used herein, the resistive element 16 is meant to describe any element that may be used to resist current flow in the superconducting loop 14. Suitable examples of the resistive element 16 include, but are not limited to, one or more resistors, one or more capacitors, and combinations thereof. In FIG. 1, $I_b$ is the bias current, $I_0$ is the critical current of the SQUID 10, $\Phi$ is the flux threading the SQUID 10 and V is the voltage response of the SQUID 10 to that flux.

The presence of the resistive element 16 in the SQUID 10 allows the voltage response V of the SQUID 10 to be attenuated below a threshold value. The presence of the resistive element 16 in the superconducting loop 14 also reduces 1/f noise and reduces flux trapped in the superconducting loop 14, where f is a frequency of the frequency of a magnetic signal to which the SQUID 10 is exposed. The origins on 1/f noise in superconductors is not ubiquitously agreed upon but one possible source of 1/f noise is fluctuations in the magnitude of the critical current of the Josephson junctions. The threshold value may be any desired value depending on the desired performance of the SQUID 10. For example, an embodiment of the SQUID 10 may be used to sense the morphology of the QRS complex in a magnetocardiography application. In such an application, the threshold may be set to 2-3 Hertz (Hz), or for time series traces, the threshold may be set to less than 1 Hz. The SQUID 10 may be used in other applications as well such as, but not limited to, Geophysics, in particular, transient electromagnetics (TEM). In other embodiments of the SQUID 10 the threshold may be set to tens of Hz or higher depending on the application. The unique properties of the SQUID 10 allow it to be successfully used in mobile applications where the SQUID 10 is undergoing angular motion in the Earth's magnetic field.

Consider rotation in Earth's magnetic field of an embodiment of the SQUID 10 having a sensitivity of 10 fT/√Hz. Rotating this embodiment of the SQUID 180° in the Earth's magnetic field (~50 µT), sweeps out a 100 µT change in detected field, equivalent to needing a 200 dB dynamic range, far in excess of any available SQUID electronics. The sensitivity of 10 fT/√Hz is equivalent to an angular sensitivity of 65 µarc seconds. The SQUID 10 may be a DC SQUID comprising either high or low temperature semiconductors. Note that the embodiment of the SQUID 10 shown in FIG. 1 is not shown as being coupled to a pickup coil or an input coil of a superconducting flux transformer.

The resistive element 16 may be any device configured to impede current flow in the superconducting loop 14. The resistive elements can be fabricated by different methods and can be made of metals such as gold and palladium or a combination of different metals. For example, suitable embodiments of the resistive element 16 include, but are not limited to, a resistor, and a capacitor. The resistive element 16 may have any desired value depending on the desired application of the SQUID 10. For example, in one embodiment of the SQUID 10, the resistive element 16 has an electric resistance between $10^{-11}\Omega$ and $10^{-5}\Omega$. FIG. 1 shows an embodiment of the SQUID 10 where the resistive element 16 is a resistor.

Figure 2A:
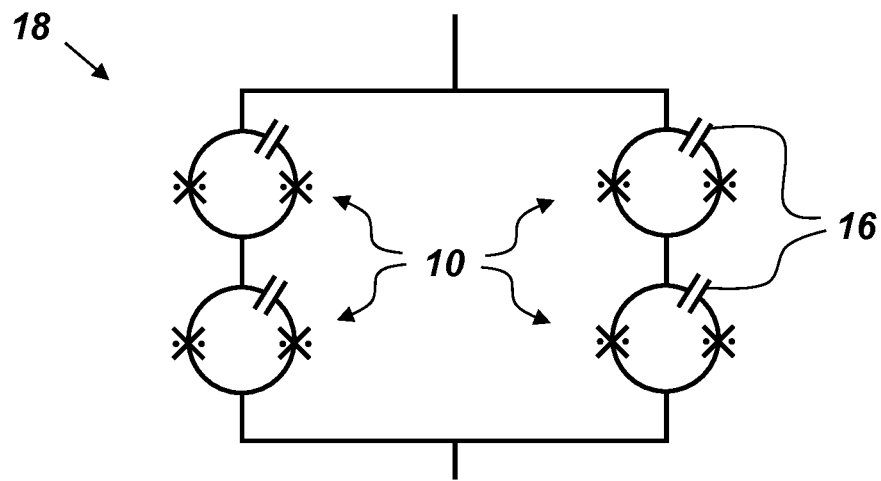
FIGS. 2A and 2B are examples of SQUIDs with resistive elements coupled together in an array.
Figure 2B:
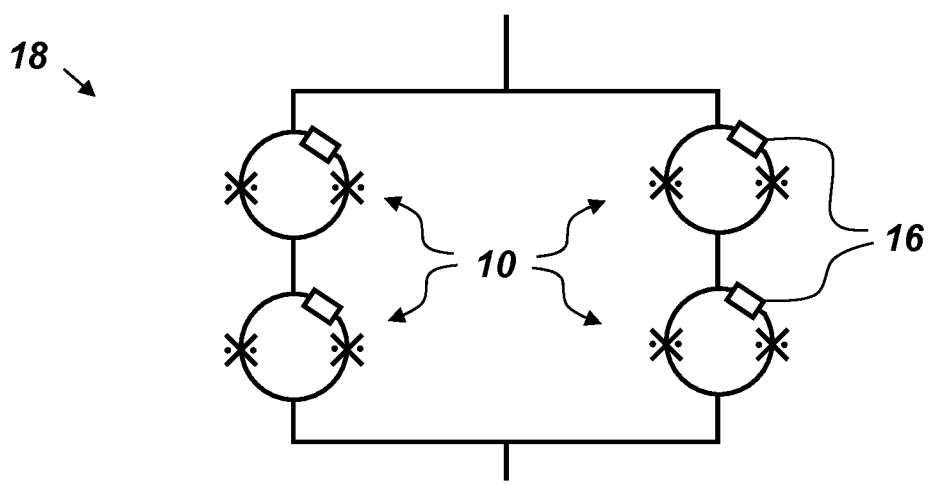

FIGS. 2A and 2B are illustrations of different embodiments of a SQUID array 18. In FIG. 2A, the SQUID array 18 is a 2×2, series-coupled array of SQUIDs 10, wherein each of the resistive elements 16 is a capacitor. In FIG. 2B, the SQUID array 18 is a 2×2, series-coupled array of SQUIDs 10, wherein each of the resistive elements 16 is a resistor. The resistive elements in the SQUID array 18 need not all be identical. In other words, the SQUID array 18 may comprise more than one type of resistive element 16 in the same array.

Figure 3A:
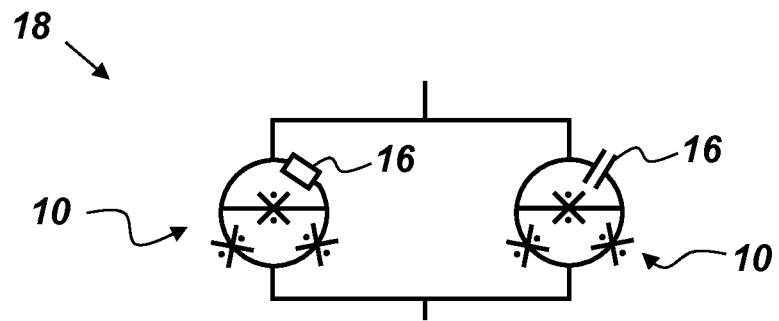
FIGS. 3A and 3C are examples of SQUIDs with resistive elements coupled together in an array.

FIG. 3A is an illustration of an example embodiment of the SQUID array 18 comprising two bi-SQUID embodiments of the SQUID 10 in a 1×1 array. In this embodiment, the resistive element 16 of one of the SQUIDs 10 is a resistor and the resistive element 16 of the other SQUID 10 is a capacitor.

Figure 3B:
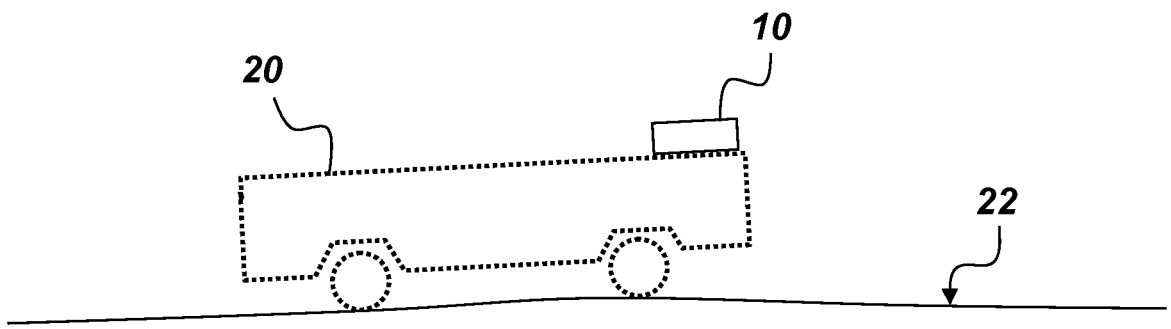
FIG. 3B is an illustration of a SQUID sensor mounted to a mobile platform.

FIG. 3B is an illustration of the SQUID 10 mounted on a mobile platform 20 moving over the ground 22. The SQUID 10 may be incorporated into a variety of different devices such as, but not limited to, low-noise amplifiers, biomagnetic imaging sensors, nondestructive evaluation sensors, and geomagnetic exploration sensors. While a wheeled vehicle is depicted in FIG. 3B as the mobile platform 20, it is to be understood that the mobile platform 20 may be any platform designed to move: over or under the ground, through water (on the surface or below), through the air, or through space.

Figure 3C:
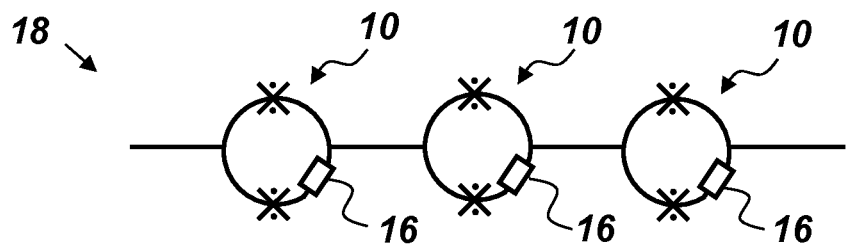

FIG. 3C is an illustration of an embodiment of the SQUID array 18 that comprises three SQUIDs 10 coupled together in series. The individual SQUIDs 10 in the SQUID array 18 may be coupled together in series, in parallel, or a combination of both.

From the above description of the SQUID 10, it is manifest that various techniques may be used for implementing the concepts of the SQUID 10 without departing from the scope of the claims. The described embodiments are to be considered in all respects as illustrative and not restrictive. The method/apparatus disclosed herein may be practiced in the absence of any element that is not specifically claimed and/or disclosed herein. It should also be understood that SQUID 10 is not limited to the particular embodiments described herein, but is capable of many embodiments without departing from the scope of the claims.

We claim:

1. A superconducting quantum interference device (SQUID) for mobile magnetic sensing applications comprising:
   at least two Josephson junctions electrically connected to a superconducting loop in the SQUID, wherein the SQUID is a direct current (DC) SQUID that generates a DC response to magnetic flux; and
   a resistive element disposed in the superconducting loop and connected in series with one of the Josephson junctions in the superconducting loop such that the DC response of the SQUID is attenuated below a threshold value as the SQUID moves through a magnetic field.

2. The SQUID of claim 1, wherein the resistive element is a resistor.

3. The SQUID of claim 1, wherein the resistive element is a capacitor.

4. The SQUID of claim 1, wherein the resistive element comprises at least one resistor and at least one capacitor.

5. The SQUID of claim 1, wherein the SQUID is mounted to a mobile platform.

6. The SQUID of claim 5, wherein the SQUID is not connected to a feedback loop.

7. The SQUID of claim 1, wherein the SQUID is electrically coupled to and forms a part of an array of SQUIDs wherein each SQUID in the array comprises the same characteristics as the SQUID of claim 1.

8. The SQUID of claim 1, wherein the SQUID is designed to rotate with respect to Earth's magnetic field.

9. The SQUID of claim 1, wherein the SQUID comprises three Josephson junctions coupled together to form a bi-SQUID.

10. A superconducting quantum interference device (SQUID) array for mobile magnetic sensing applications comprising:
    a plurality of direct current (DC) SQUIDs electrically connected together to form the array, wherein each of the DC SQUIDs comprises two Josephson junctions electrically connected to a superconducting loop, and a resistive element disposed in the superconducting loop and connected in series between the Josephson junctions within the superconducting loop such that a DC response of the SQUID array to magnetic flux is attenuated below a threshold value as the SQUID array rotates through a magnetic field.

11. The SQUID array of claim 10, wherein the resistive element is selected from the group consisting of a resistor and a capacitor.

12. The SQUID array of claim 10, wherein the SQUIDs are electrically connected together in series.

13. The SQUID array of claim 10, wherein the SQUIDs are electrically connected together in parallel.

14. The SQUID array of claim 10, wherein the SQUIDs are electrically connected together in a combination of parallel and series coupling.

15. The SQUID array of claim 10, wherein the array comprises at least one SQUID having a resistor as the resistive element and at least one SQUID having a capacitor as the resistive element.

16. The SQUID array of claim 10, wherein none of the SQUIDs are connected to a pickup coil.

17. The SQUID array of claim 16, wherein the resistive element in the superconducting loop reduces 1/f noise, where f is a frequency of the magnetic field through which the SQUID array is moving.

\* \* \* \* \*